United States Patent [19]
Connell et al.

[11] Patent Number: 5,977,840
[45] Date of Patent: Nov. 2, 1999

[54] CIRCUIT FOR MINIMIZING TURN-ON TIME OF TEMPERATURE COMPENSATED CRYSTAL OSCILLATOR

[75] Inventors: Lawrence E. Connell; Alexander Dribinsky, both of Naperville, Ill.

[73] Assignee: CTS Corporation, Elkhart, Ind.

[21] Appl. No.: 09/069,581

[22] Filed: Apr. 29, 1998

[51] Int. Cl.⁶ .................................. H03B 5/32; H03L 1/02
[52] U.S. Cl. ........................ 331/158; 331/176; 331/177 V
[58] Field of Search ........................... 331/116 R, 116 FE, 331/158, 176, 177 V

[56] References Cited

U.S. PATENT DOCUMENTS 3,970,966  7/1976  Keller et al. ............................. 331/176
5,389,899  2/1995  Yahagi et al. ........................... 331/176

*Primary Examiner*—Siegfried H. Grimm
*Attorney, Agent, or Firm*—Jones, Day, Reavis & Pogue

[57] ABSTRACT

A temperature compensated crystal oscillator with an improved phase noise characteristic and a fast start up time includes a large time constant low-pass filter coupled to a temperature compensation circuit. At start up the low pass filter is effectively bypassed to enable the temperature compensation voltage and oscillator output frequency to settle quickly. A capacitance in the low-pass filter is precharged by a precharge circuit to match the temperature compensation voltage without disturbing the temperature compensation circuit and the concurrent settling of the oscillator. When the capacitance is fully charged, the low-pass filter is enabled without unsettling the oscillator output frequency.

18 Claims, 3 Drawing Sheets

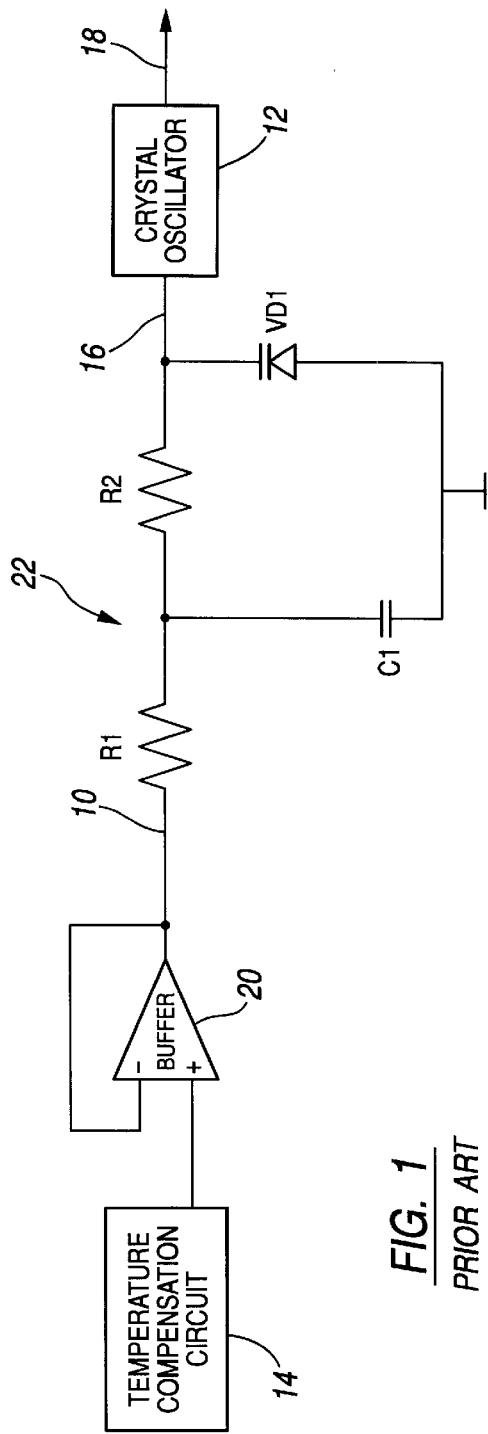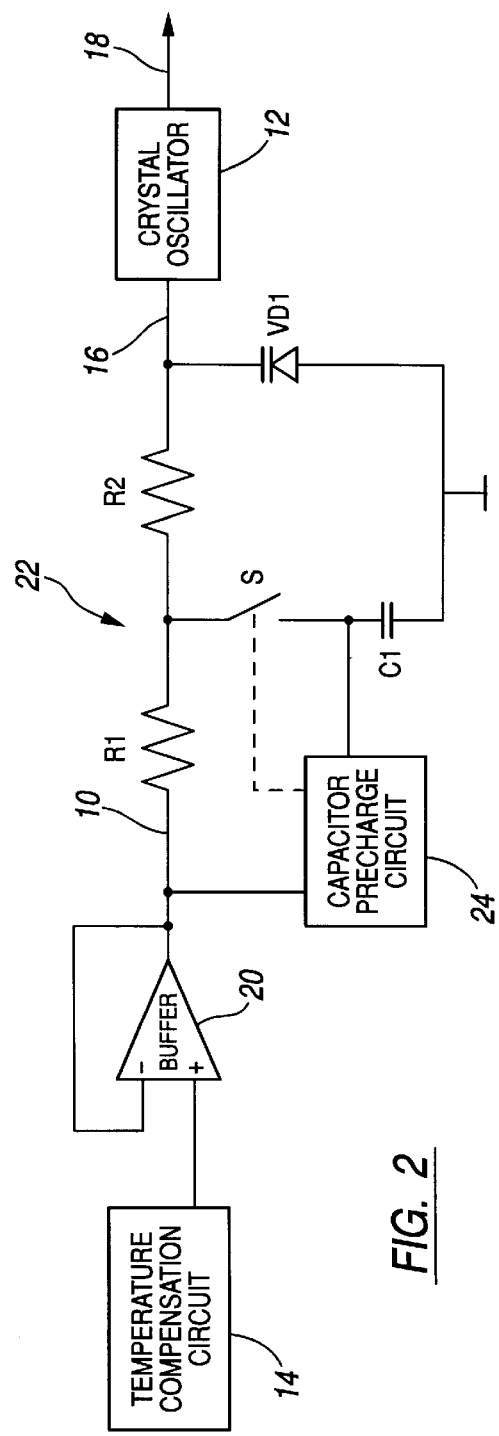
FIG. 1
PRIOR ART
FIG. 2

CIRCUIT FOR MINIMIZING TURN-ON TIME OF TEMPERATURE COMPENSATED CRYSTAL OSCILLATOR

FIELD OF THE INVENTION

The present invention relates generally to the field of crystal oscillators, and particularly, to temperature compensated crystal oscillators used in communication devices and microprocessors.

BACKGROUND OF THE INVENTION

Oscillators that have a frequency determining crystal are commonly used to provide a stable output frequency. However, the crystals used in these oscillators are temperature sensitive and are therefore required to be temperature compensated to maintain a stable oscillator output frequency.

A temperature compensated crystal oscillator (TCXO) generally includes a temperature compensation circuit which generates a temperature variable output voltage which is applied to a frequency control input to stabilize the oscillator output frequency over temperature. To improve phase noise prior art TCXOs use a low-pass filter with a large time constant to remove unwanted noise generated at the output voltage. Unfortunately, when power is turned on to the TCXO, the low-pass filter takes a long time to settle and, consequently, the oscillator takes a long time to stabilize to the correct temperature compensated output frequency.

Typically, prior art TCXOs use a low-pass filter with a twenty millisecond time constant to sufficiently attenuate output noise from the temperature compensation circuit. At power on, these TCXOs require about ten to twelve milliseconds for their output frequencies to settle to within specifications. This startup delay is unacceptable for modern communication systems, including cellular telephones and two-way radios, which require low-power crystal oscillators that provide a stable output frequency with low phase noise almost immediately after turn-on. In particular, many cellular radios which use a discontinuous receive mode require startup delays of less than three milliseconds.

Integrated circuit (IC) based TCXOs have been unable to achieve three millisecond startup times. TCXOs made up of discrete components have fast startup times, but are relatively large and expensive. In addition, their phase noise degrades with temperature.

There is a need for a low power TCXO that has a fast startup time with improved phase noise. There is also a need for a TCXO that retains the advantages of IC based TCXOs with the performance of discrete component TCXOs.

BRIEF DESCRIPTION OF THE DRAWINGS

FIG. 1 is a simplified schematic diagram of a prior art temperature compensation block of a TCXO;

FIG. 2 is a simplified schematic diagram of a TCXO, in accordance with the present invention;

DETAILED DESCRIPTION OF THE PREFERRED EMBODIMENT

Figure 3:
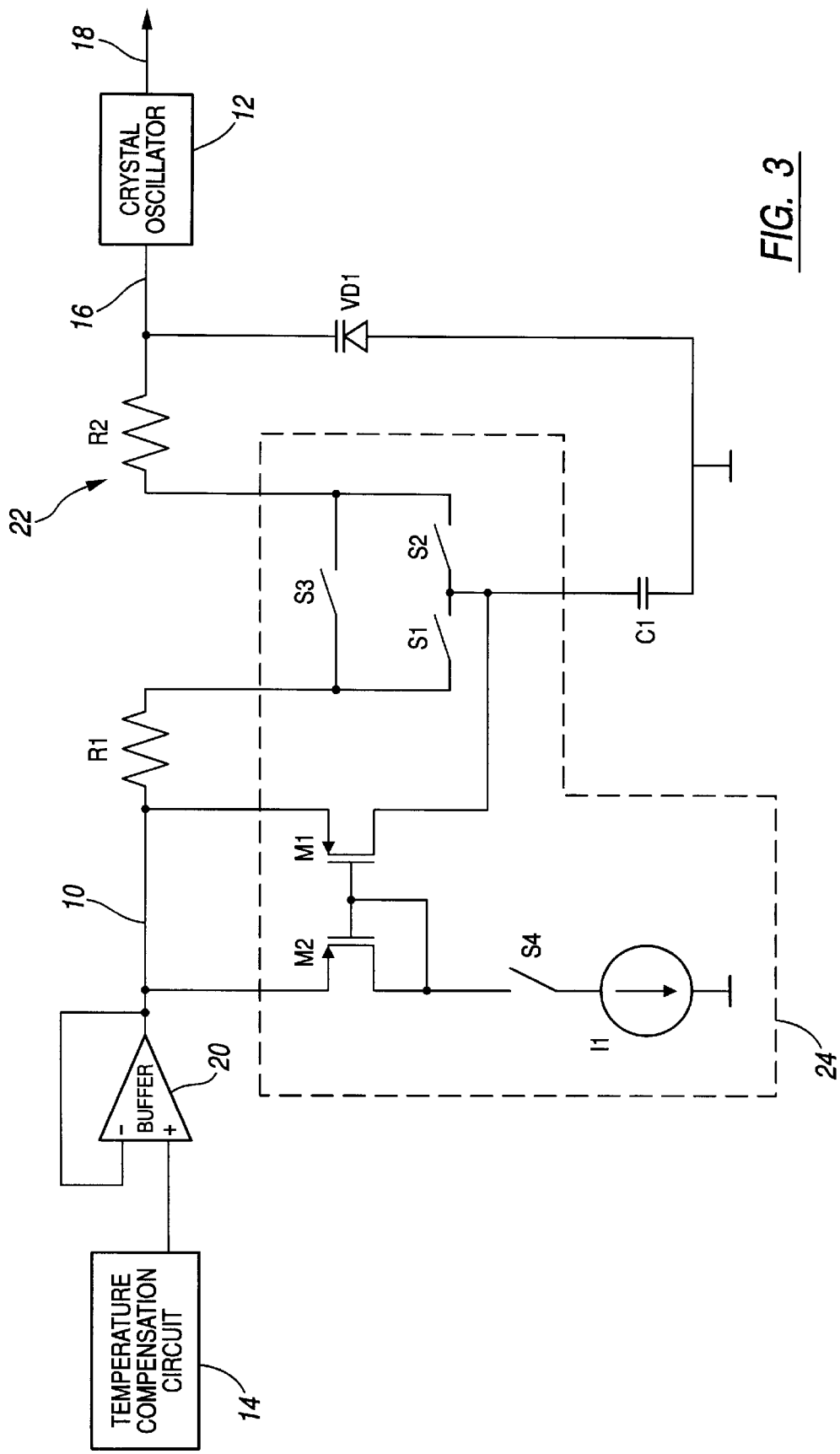
FIG. 3 is a simplified schematic diagram of a preferred embodiment of a TCXO, in accordance with the present invention.

The present invention provides an integrated low power TCXO that has a fast startup time with improved phase noise. The TCXO is able to provide these advantages while retaining the large filter capacitor as used in the prior art by disconnecting the filter capacitor from the oscillator circuit and precharging it while the oscillator circuit is starting. This allows the simultaneous execution of two slow processes: oscillator startup and filter capacitor precharge, thereby shortening the time for the integrated TCXO to reach a stable operating frequency.

FIG. 1 shows a prior art temperature compensation circuit 14 providing a temperature compensating control signal 10 to a crystal oscillator 12. The temperature compensation circuit 14 provides the temperature compensating control signal 10 as a function of temperature. When this signal 10 is applied to an oscillator input 16, it compensates the temperature drift of a frequency at an oscillator output 18. BUFFER 20 may be used or omitted, depending on the design of the temperature compensation circuit 14.

The temperature compensating control signal 10 is preferably a voltage coupled to drive shunt-connected varactor VD1 through series-connected resistor R2. Varactor VD1 changes capacitance in response to a change in its applied voltage. Subsequently, the crystal oscillator 12 changes the frequency at its output 18 in response to changes in capacitance present at the crystal oscillator input 16.

The temperature compensation circuit 14 requires a large gain to generate the temperature compensating control signal 10 over temperature. The temperature compensation circuit 14 also requires the use of a noisy bandgap voltage reference input (not shown) which is amplified by the large gain of the temperature compensation circuit 14. As a result, the temperature compensation circuit 14 is the dominant source of noise in the TCXO. In the prior art, the solution to reduce the noise was to use a large filter capacitor, C1.

Resistor R1 and capacitor C1 are connected as a low-pass filter to reduce noise present on the temperature compensating control signal 10. Voltage noise that is coupled to the varactor VD1 at the crystal oscillator input 16 is subsequently converted to phase noise on the crystal oscillator output 18, degrading the performance of the TCXO. In order to have high noise rejection at the frequencies of interest, the low pass filter (R1,C1) is coupled between the temperature compensation circuit 14 and a frequency control input 22 to the crystal oscillator input 16. To reduce low frequency noise sufficiently, the low-pass filter is required to have a large time constant (i.e. the filter capacitor C1 takes a long time to charge to its operating voltage when power is first applied to the TCXO). Typically, this time constant is on the order of multiple milliseconds. When the TCXO, is powered up, the voltage across the filter capacitor C1 is about zero volts. Even though the temperature compensation circuit 14 powers up quickly to provide a usable temperature compensating control signal 10, it will take a longer time for the voltage at the frequency control input 22, and the frequency at the crystal oscillator output 18, to settle.

FIG. 2 shows a temperature compensated crystal oscillator including a crystal oscillator 12 having an oscillator output 18 and an oscillator input 16 adapted to receive a signal for changing a frequency at the oscillator output 18. A temperature compensation circuit 14 provides a temperature compensating control signal 10 through a low-pass filter (R1,C1) including a filter capacitance C1 to the crystal oscillator input 16 to adjust the output frequency over a predetermined temperature range. A capacitor precharge circuit 24 disables the low-pass filter (represented by switch S) and precharges the filter capacitance C1 during a turn-on time for the temperature compensated crystal oscillator such that the delay from the temperature compensating control signal 10 to the oscillator input is substantially less than the delay through the low-pass filter when the low-pass filter is enabled, and the capacitor precharge circuit 24 enables the low-pass filter after the turn-on time such that the temperature compensating control signal 10 is substantially not disturbed by the precharge circuit during the turn-on time.

Preferably, the capacitor precharge circuit 24 disables the low-pass filter (R1,C1) by switchably disconnecting the filter capacitance C1 out of the low-pass filter, and the capacitor precharge circuit 24 enables the low-pass filter by switchably connecting the filter capacitance C1 into the low-pass filter.

The turn-on time should be sufficient for the capacitor precharge circuit 24 to precharge the filter capacitance C1 to a substantially nominal operating voltage that is substantially equal to the temperature compensating control signal 10.

In a preferred embodiment, the capacitor precharge circuit provides a controlled current to the filter capacitance during the turn-on time. FIG. 3 shows a simplified schematic diagram of a preferred embodiment of a TCXO, in accordance with the present invention. The reference numbers describing elements of the TCXO circuit of FIG. 2 are identical to those of FIG. 3, and the description thereof is hereby incorporated by reference.

Preferably, the temperature compensating control signal is coupled through a buffer 20 such that the temperature compensating control signal does not change substantially when a current load is applied. A transistor M1 is coupled from the buffer output to the filter capacitance C1 and is used to precharge the filter capacitance C1 during startup. Also, transistor M1 is beneficially used to control the current flowing into filter capacitance C1, so as to enable the correct temperature compensating voltage to be immediately presented to the crystal oscillator input 16 at startup while allowing the crystal oscillator to settle concurrently with the charging of the filter capacitance C1. The charging current to filter capacitance C1 should be as high as possible to charge the capacitor quickly, but should be smaller than the maximum current that buffer 20 can supply without affecting the buffer output voltage.

Transistor M1 is configured in a current mirror with transistor M2 which is also coupled at the output of buffer 20. The value of the charging current through transistor M1 to the filter capacitance C1 is set by a current mirror (M1,M2) incorporating current scaling. The gate width-to-length ratio of transistor M1 is made much larger than that of transistor M2 so that the drain current of transistor M2 does not significantly load the output of buffer 20. The drain current of transistor M2 is coupled through switch S4 and is controlled by a current source I1. Switches S1 and S2 are coupled in series between the buffer output and the crystal oscillator with the filter capacitance C1 coupled in shunt therebetween. Switch S3 is connected in parallel across switches S1 and S2.

When power is applied to the TCXO, switches S1 and S2 are opened and switches S3 and S4 closed and there is little delay between the buffer output and the crystal oscillator input, enabling the oscillator output frequency to settle quickly. At this time, filter capacitance C1 will be at about zero volts, and there is a large difference between the voltage on filter capacitance C1 and the temperature compensating control signal 10 from the buffer output. The drain current of transistor M1 will be A times the drain current of transistor M2, where A is the ratio of transconductances of the scaled transistors M1 and M2. Transistor M1 will be in saturation. However, as the voltage on filter capacitance C1 approaches that of the temperature compensating control signal 10 from the buffer output, transistor M1 will come out of its saturation region and the charging current to the filter capacitance C1 will decrease. After a sufficient time, the voltage on the filter capacitance C1 will substantially equal the temperature compensation voltage from the output of buffer 20. At such time, switches S1 and S2 are closed, switches S3 and S4 are opened turning off transistor M1, completing the precharge cycle.

The timing of switches S1 through S4 can be predetermined and controlled by a separate timing signal (not shown). The turn-on time is typically predetermined based upon the filter capacitance value, the amount of precharge current, and the crystal oscillator circuit start-up time. Alternatively, the timing signal can be generated from a digital down counter and an SR (set-reset) latch. The output of the SR latch is used to control the state of switches S1 through S4. At power on, the counter and SR latch are reset and switches S1 and S2 are opened while switches S3 and S4 are closed. The counter is then clocked with a signal derived from the crystal oscillator output. When the counter reaches a predetermined output state, the SR latch is set and switches S1 and S2 are closed while switches S3 and S4 are opened.

The present invention also encompasses a method for providing a temperature compensated crystal oscillator having an improved turn-on time. A first step of the method includes providing a crystal oscillator having an oscillator output and an oscillator input adapted to receive a signal for changing a frequency at the oscillator output and a temperature compensation circuit which provides a temperature compensating control signal through a low-pass filter, including a switchable filter capacitance, to the crystal oscillator input for adjusting the output frequency over a predetermined temperature range.

A second step includes switchably disconnecting the filter capacitance from the low-pass filter when power is first applied to the temperature compensated crystal oscillator.

A third step includes charging the filter capacitance with a current at a maximum rate without substantially disturbing the temperature compensating control signal during a turn-on time.

A last step includes switchably connecting the filter capacitance into the low-pass filter after the turn-on time.

Preferably, the turn-on time of the charging and connecting steps is sufficient in length for the filter capacitance to obtain a voltage substantially equal to a voltage of the temperature compensating control signal.

In a preferred embodiment, the current of the charging step is controlled to the filter capacitance during the turn-on time. The turn-on time of the charging and connecting steps is controlled by a separate timing signal as detailed above.

In particular, the providing step includes the temperature compensating control signal being coupled through a buffer such that the temperature compensating control signal does not change substantially when a current load is applied. This can be accomplished where the providing step includes a first transistor coupled from a buffer output to the filter capacitance so as to precharge the filter capacitance during the charging step.

Preferably, the providing step includes the first transistor configured in a scaled current mirror with a second transistor which is coupled at the buffer output, and wherein the charging step includes the current flowing through the first transistor to the filter capacitance being controlled by the current mirror such that a drain current of the second transistor does not significantly load the buffer output.

More particularly, the providing step includes the drain current of the second transistor being controlled by a switchably coupled current source, a first and second switch being coupled in series between the buffer output and the crystal oscillator input with the filter capacitance coupled in shunt therebetween, and a third switch being connected in parallel across the first and second switches.

Figure 5:
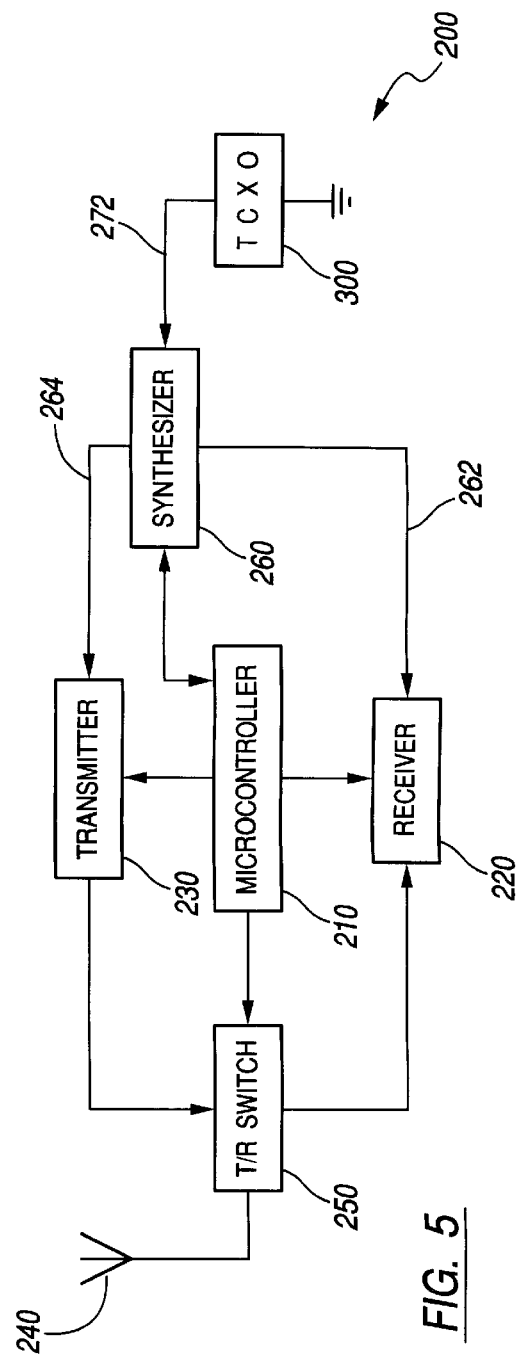
FIG. 5 is a block diagram of a communication device which uses the temperature compensated crystal oscillator of the present invention.

FIG. 5 shows a block diagram of a communication device 200 which includes a temperature compensated crystal oscillator 300, in accordance with the present invention. In one embodiment, the communication device 200 is a receiver. In another embodiment, the communication device 200 comprises a well known frequency synthesized two-way transceiver which operates under the control of a microcontroller 210 or microprocessor. The communication device 200 includes a receiver 220 and a transmitter 230 which receive and transmit RF via an antenna 240. The antenna 240 is appropriately switched between the receiver 220 and the transmitter 230 by an antenna switch 250. The communication device 200 also includes a well known phase locked loop synthesizer 260 which under the control of the microcontroller 210 provides a receiver local oscillator signal 262 and a transmitter local oscillator signal 264. The temperature compensated crystal oscillator 300 provides a reference oscillator signal 272 for the synthesizer 260. The reference oscillator signal 272 is temperature compensated utilizing the principles of the present invention.

EXAMPLE

A TCXO was constructed in accordance with the present invention, as represented in FIG. 3. The TCXO was subsequently tested in its ability to achieve a stable nominal operating frequency upon startup. Two tests were conducted. A first test left switches S1 and S2 closed and switches S3 and S4 open with no current being supplied by transistor M1 (i.e. the capacitor precharge circuit was disabled). A second test enabled the capacitor precharge circuit such that the TCXO was operated as described above, in accordance with the present invention.

Figure 4:
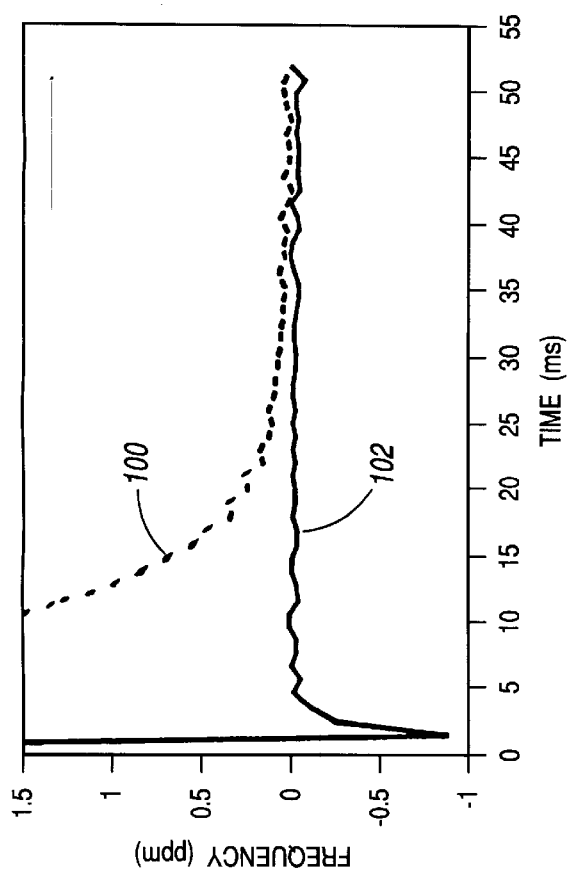
FIG. 4 is a graphical representation of the startup times of the TCXO of FIG. 3.

As can be seen from FIG. 4, the first curve 100 representing the first test had a much longer turn-on time than the second curve 102 representing the second test. This demonstrates the effectiveness of the present invention. In particular, the present invention provides startup time, to reach a stable operating frequency within specifications (±0.5 ppm), of about two milliseconds, which is comparable with the more expensive prior art discrete component solutions and much better than prior art integrated solutions.

Although various embodiments of this invention have been shown and described, it should be understood that various modifications and substitutions, as well as rearrangements and combinations of the preceding embodiments, can be made by those skilled in the art, without departing from the novel and broad scope of this invention.

What is claimed is:

1. A temperature compensated crystal oscillator having an improved turn-on time, comprising:

a crystal oscillator having an oscillator output and an oscillator input adapted to receive a signal for changing a frequency at the oscillator output;

a temperature compensation circuit which provides a temperature compensating control signal, through a low-pass filter including a filter capacitance, to the crystal oscillator input to adjust the output frequency over a predetermined temperature range; and a capacitor precharge circuit which disables the low-pass filter and precharges the filter capacitance during a turn-on time for the temperature compensated crystal oscillator, and enables the low-pass filter after the turn-on time such that the delay from the temperature compensating control signal to the oscillator input is substantially less than the delay when the low-pass filter is enabled.

2. The temperature compensated crystal oscillator of claim 1, wherein the capacitor precharge circuit disables the low-pass filter by switchably disconnecting the filter capacitance out of the low-pass filter, and the capacitor precharge circuit enables the low-pass filter by switchably connecting the filter capacitance into the low-pass filter.

3. The temperature compensated crystal oscillator of claim 1, wherein the turn-on time is sufficient for the capacitor precharge circuit to precharge the filter capacitance to a substantially nominal operating voltage.

4. The temperature compensated crystal oscillator of claim 1, wherein the capacitor precharge circuit provides a controlled current to the filter capacitance during the turn-on time.

5. The temperature compensated crystal oscillator of claim 1, wherein the turn-on time is controlled by a separate timing signal.

6. The temperature compensated crystal oscillator of claim 1, wherein the temperature compensating control signal is coupled through a buffer such that the temperature compensating control signal does not change substantially when a current load is applied.

7. The temperature compensated crystal oscillator of claim 6, wherein the capacitor precharge circuit includes a first transistor coupled from a buffer output to the filter capacitance so as to precharge the filter capacitance during the turn-on time.

8. The temperature compensated crystal oscillator of claim 7, wherein the capacitor precharge circuit includes the first transistor configured in a current mirror with a second transistor which is coupled at the buffer output, a charging current through the first transistor to the filter capacitance is controlled by the current mirror which incorporates current scaling between the first and second transistor such that a drain current of the second transistor does not significantly load the buffer output.

9. The temperature compensated crystal oscillator of claim 8, wherein the capacitor precharge circuit includes the current of the second transistor being controlled by a switchably coupled current source, and wherein a first and second switch are coupled in series between the buffer output and the crystal oscillator input with the filter capacitance coupled in shunt therebetween, and a third switch is connected in parallel across the first and second switches.

10. A communication device having a receiver and a temperature compensated crystal oscillator having an improved turn-on time, comprising:

a crystal oscillator having an oscillator output and an oscillator input adapted to receive a signal for changing a frequency at the oscillator output;

a temperature compensation circuit which provides a temperature compensating control signal through a low-pass filter including a filter capacitance to the crystal oscillator input to adjust the output frequency over a predetermined temperature range; and a capacitor precharge circuit which disables the low-pass filter and precharges the filter capacitance during a turn-on time for the temperature compensated crystal oscillator, and enables the low-pass filter after the turn-on time such that the delay from the temperature compensating control signal to the oscillator input is substantially less than the delay when the low-pass filter is enabled.

11. A method for providing a temperature compensated crystal oscillator having an improved turn-on time, comprising the steps of:

provicing a crystal oscillator having an oscillator output and an oscillator input adapted to receive a signal for changing a frequency at the oscillator output and a temperature compensation circuit which provides a temperature compensating control signal, through a low-pass filter including a switchable filter capacitance, to the crystal oscillator input for adjusting the output frequency over a predetermined temperature range;

switchably disconnecting the filter capacitance from the low-pass filter when power is applied to the temperature compensated crystal oscillator;

charging the filter capacitance with a current at a maximum rate without substantially disturbing the temperature compensating control signal during a turn-on time; and switchably connecting the filter capacitance into the low-pass filter after the turn-on time.

12. The method of claim 11, wherein the turn-on time of the charging and connecting steps is sufficient in length for the filter capacitance to a obtain a voltage substantially equal to a voltage of the temperature compensating control signal.

13. The method of claim 11, wherein the current of the charging step is controlled to the filter capacitance during the turn-on time.

14. The method of claim 11, wherein the turn-on time of the charging and connecting steps is controlled by a separate timing signal.

15. The method of claim 11, wherein the providing step includes the temperature compensating control signal being coupled through a buffer such that the temperature compensating control signal does not change substantially when a current load is applied.

16. The method of claim 15, wherein the providing step includes a first transistor coupled from a buffer output to the filter capacitance so as to precharge the filter capacitance during the charging step.

17. The method of claim 16, wherein the providing step includes the first transistor configured in a scaled current mirror with a second transistor which is coupled at the buffer output, and wherein the charging step includes the current flowing through the first transistor to the filter capacitance being controlled by the current mirror such that a drain current of the second transistor does not significantly load the buffer output.

18. The method of claim 17, wherein the providing step includes the current of the second transistor being controlled by a switchably coupled current source, a first and second switch being coupled in series between the buffer output and the crystal oscillator input with the filter capacitance coupled in shunt therebetween, and a third switch being connected in parallel across the first and second switches.

* * * * *